(12) United States Patent
Barnette

(10) Patent No.: US 6,356,860 B1
(45) Date of Patent: Mar. 12, 2002

(54) METHOD OF GRID GENERATION

(75) Inventor: Daniel W. Barnette, Veguita, NM (US)

(73) Assignee: Sandia Corporation, Alququerque, NM (US)

( * ) Notice: Subject to any disclaimer, the term of this patent is extended or adjusted under 35 U.S.C. 154(b) by 0 days.

(21) Appl. No.: 09/169,308

(22) Filed: Oct. 8, 1998

(51) Int. Cl.[7] .......................... G06F 17/50; G06F 7/60; G06F 17/10; G06G 7/48; G06G 7/50
(52) U.S. Cl. ..................... 703/2; 703/1; 703/7; 703/9
(58) Field of Search ............................ 703/2, 9, 1, 7

(56) References Cited

U.S. PATENT DOCUMENTS 5,537,641 A * 7/1996 Lobo et al. ................. 345/419
5,801,969 A * 9/1998 Nagahama ..................... 703/9

OTHER PUBLICATIONS

Lin et al.; "Automatic grid refinement and higher order flux discretization for diffusion modelin"; IEEE Trans. Comp. Aided Design of Int. Circuits; pp. 1209–1216, Aug. 1993.*

Edwards: "Elimination of adaptive grid interface errors in the discrete cell centered pressure equation"; J. Computational Physics; pp. 356–372, Jul. 1996.*

Eiseman, "Automatic Structured Grid Generation," in *Computatiional Fluid Dynamics Review 1996*.

* cited by examiner

*Primary Examiner*—Kevin J. Teska
*Assistant Examiner*—Hugh Jones
(74) *Attorney, Agent, or Firm*—V. Gerald Grafe

(57) ABSTRACT

The present invention provides a method of grid generation that uses the geometry of the problem space and the governing relations to generate a grid. The method can generate a grid with minimized discretization errors, and with minimal user interaction. The method of the present invention comprises assigning grid cell locations so that, when the governing relations are discretized using the grid, at least some of the discretization errors are substantially zero. Conventional grid generation is driven by the problem space geometry; grid generation according to the present invention is driven by problem space geometry and by governing relations. The present invention accordingly can provide two significant benefits: more efficient and accurate modeling since discretization errors are minimized, and reduced cost grid generation since less human interaction is required.

8 Claims, 10 Drawing Sheets

METHOD OF GRID GENERATION

METHOD OF GRID GENERATION

This invention was made with Government support under Contract DE-AC04-94AL85000 awarded by the U.S. Department of Energy. The Government has certain rights in the invention.

BACKGROUND OF THE INVENTION

This invention relates to the field of grid generation, specifically grid generation for computer modeling of governing relations over a problem space.

Computers can be used to model processes or relations occurring in a problem space. For example, computers can be used to model fluid or heat flow through a problem space such as a chamber, a mechanical part, or a portion of the world. The conventional approach involves the following steps:

1. Represent by governing relations (or governing equations) the process or relations to be modeled.
2. Construct a grid that represents the problem space and segregates it into cells appropriate to the resolution of model desired.
3. Discretize the governing relations to the grid cell boundaries.
4. Represent initial and boundary conditions.
5. Solve the governing relations for the grid cells using the initial and boundary conditions.
6. Iterate if necessary (for example, if the governing relations require iteration for convergence).

The governing relations matching many processes are continuous relations. Discretizing such governing relations can introduce discretization errors. Discretization errors can delay or even prevent convergence, making an accurate model more expensive or even impossible to obtain. They can also compromise the accuracy of the resulting model.

Generating a grid that represents the problem space also incurs substantial cost. Grid generation conventionally requires significant interaction and direction from a human user. Specialized grid generation expertise and complex grid generation tools are typically employed to help generate a grid that represents the problem space and is amenable to computer solution of the governing relations. See, e.g., Thompson et al., Numerical Grid Generation—Foundations and Applications, Elsevier Science Publishing Company, 1985; Carey, Computational Grids—Generation, Adaptation, and Solution Strategies, Taylor and Francis Publishing Company, 1997; Hoffman and Chiang, Computational Fluid Dynamics for Engineers, Engineering Education System, Wichita, Kans., USA, 1993. Correction of deficiencies in the grid typically requires expert analysis of the model results and another costly application of the grid generation expertise and tools.

The cost and deficiencies associated with current grid generation methods restrict the application of computers to model processes and relations. Accordingly, there is a need for grid generation methods that do not require intensive human user direction and that do not lead to modeling inaccuracies.

SUMMARY OF THE INVENTION

The present invention provides a method of grid generation that uses the geometry of the problem space and the governing relations to generate a grid. The method can generate a grid with minimized discretization errors, and with minimal user interaction.

The method of the present invention comprises assigning grid cell locations so that, when the governing relations are discretized using the grid, at least some of the discretization errors are substantially zero. Conventional grid generation is driven by the problem space geometry; grid generation according to the present invention is driven by problem space geometry and by governing relations. The present invention accordingly can provide two significant benefits: more efficient and accurate modeling since discretization errors are minimized, and reduced cost grid generation since less human interaction is required.

As an example, grid generation according to the present invention can be practiced for solving Navier-Stokes fluid flow relations. A grid can be generated so that $T_{E1}$ discretization errors are zero using the problem space geometry and the Navier-Stokes relations. Further, a refined grid can be generated so that $T_{E2}$ discretization errors are zero using the problem geometry, the Navier-Stokes relations, and intermediate solutions. Grids appropriate to the Navier-Stokes relations and the problem space can accordingly be generated with little human interaction. Also, refined grids can be generated so that finer resolution is obtained where needed, and coarser resolution is used where sufficient.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

Figure 1:
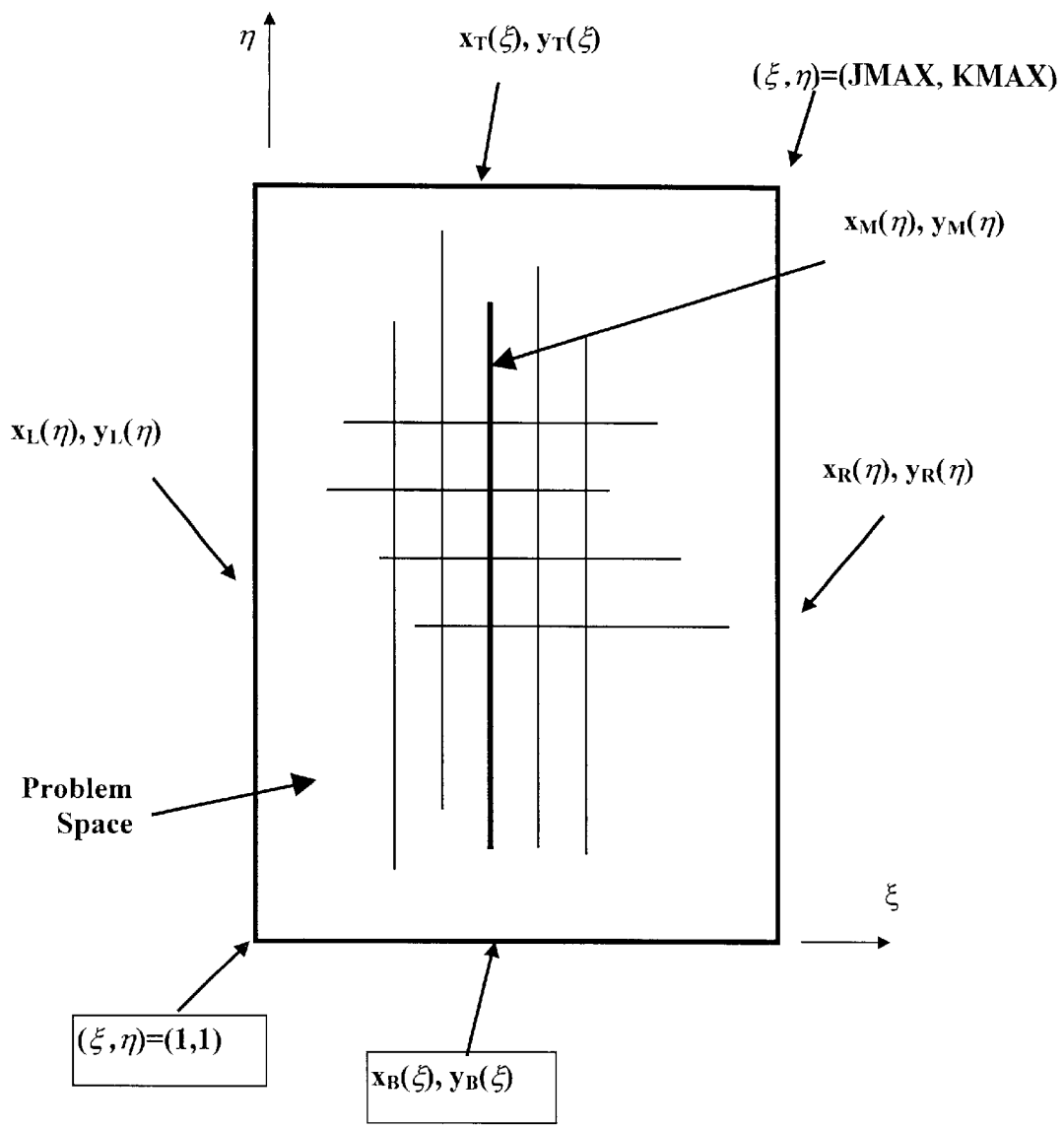
FIG. 1 is a diagram of a grid and coordinates according to the present invention.

The present invention provides a grid generation method that requires reduced human interaction and can provide increased solution speed and accuracy. Discretizing governing relations for solution on a grid can result in discretization error terms. According to the present invention, grid cell locations are assigned so that at least some of those discretization error terms are minimized. Since the grid cell locations are assigned based on the governing relations and the problem space, less human interaction is required than for conventional grid generation methods. Further, since the grid cell locations minimize discretization error terms, faster and more accurate solutions can be obtained.

The nature of the governing relations can affect what information is needed to assign grid cell locations according to the present invention. Some discretization errors can be dependent on problem space geometry and governing relations. The method of the present invention can generate grids that minimize these discretization errors before any solution is begun. Other discretization errors can further depend on the evolution of the solution. The method of the present invention accordingly can require information from initial solutions to generate grids that minimize these discretization errors. Details are provided below for practice of the present invention in conjunction with two-dimensional convection-dominated Navier-Stokes fluid flow equations, minimizing either $T_{E1}$, $T_{E2}$, or both, discretization errors. Those skilled in the art will appreciate other dimensionalities, other governing relations, and other discretization errors that are appropriate for use with the present invention.

Convection Discretization Error Terms

Two-dimensional convection terms in the Navier-Stokes equations can be written in transformed computational space as in Equation 1.

$$\frac{1}{J}\left(\rho U \frac{\partial f}{\partial \xi} + \rho V \frac{\partial f}{\partial \eta}\right) \qquad \text{Equation 1}$$

In Equation 1, f can be either the u or v covariant velocity, p is the density, and the Jacobian of the transformation is given by Equation 2.

$$J = x_\xi y_\eta - y_\xi x_\eta \qquad \text{Equation 2}$$

In Equation 1, U and V are the contravariant velocities as in Equations 3 and 4.

$$U = u y_\eta - v x_\eta \qquad \text{Equation 3}$$

$$V = v x_\xi - u y_\xi \qquad \text{Equation 4}$$

The independent variables $\xi$ and $\eta$ are the coordinate directions in computational space.

The discretization errors for convection terms can be arrived at by using second-order upwind differencing for the convection terms and second-order central differencing for the metric coefficients. The total discretization error can be expressed as in Equation 5.

$$T_E = T_{E1} + T_{E2} + \text{(higher order terms)} \qquad \text{Equation 5}$$

In Equation 5, $T_{E1}$ is given by Equation 6.

$$T_{E1} = \frac{\rho}{2J}[(Ux_{\xi\xi} + Vx_{\eta\eta})f_x + (Uy_{\xi\xi} + Vy_{\eta\eta})f_y] \qquad \text{Equation 6}$$

In Equation 5, $T_{E2}$ is given by Equation 7.

$$T_{E2} = \frac{\rho}{J}\left\{\begin{array}{l}(Ux_\xi x_{\xi\xi} + Vx_\eta x_{\eta\eta})f_{xx} + \\ [U(y_\xi x_{\xi\xi} + x_\xi y_{\xi\xi}) + V(y_\eta x_{\eta\eta} + x_\eta y_{\eta\eta})]f_{xy} + \\ (Uy_\xi y_{\xi\xi} + Vy_\eta y_{\eta\eta})f_{yy}\end{array}\right\} \qquad \text{Equation 7}$$

Note that grouping is dependent on the order of the derivative f. Derivatives of f can be taken in physical space to allow more compact form of equations; they can be transformed to computational space when necessary. The analysis of higher order terms, while within the scope of the present invention, can be quite arduous. Accordingly, the discussion below concentrates on obtaining useful grid generation information from $T_{E1}$ and $T_{E2}$.

$T_{E1}$ can be made zero as discussed below. The relations set forth allow a grid to be generated where $T_{E1}$ is zero without coupling to flow solver data. This allows the present invention to generate a grid before operation of the flow solver, similar to the sequencing required with conventional grid generation techniques.

$T_{E2}$ can be made zero as discussed below. The relations set forth allow a grid to be generated where $T_{E2}$ is zero by coupling grid generation to the flow solver through velocity gradients. The relations are $2^{nd}$ order, linear, hyperbolic, partial differential equations with variable coefficients. The algebraic results and the system of partial differential equations can form the basis of the method whereby the grid can be generated simultaneously with the development of the flow fields.

Grid Generation so $T_{E1}=0$

The derivation of grid generation relations that provide a grid with $T_{E1}=0$ can begin by setting Equation 6 to zero. One approach is to set the coefficients of $f_x$ and $f_y$ to zero independently. The resulting equations are set forth as Equations 8 and 9.

$$Ux_{\xi\xi} + Vx_{\eta\eta} = 0 \qquad \text{Equation 8}$$

$$Uy_{\xi\xi} + Vy_{\eta\eta} = 0 \qquad \text{Equation 9}$$

If a distribution in x and y that satisfies Equations 8 and 9 can be constructed, then TE1 will be zero. Rewriting Equations 8 and 9 in matrix form yields Equation 10.

$$\begin{bmatrix} x_{\xi\xi} & x_{\eta\eta} \\ y_{\xi\xi} & y_{\eta\eta} \end{bmatrix} \begin{Bmatrix} U \\ V \end{Bmatrix} = \begin{Bmatrix} 0 \\ 0 \end{Bmatrix} \qquad \text{Equation 10}$$

A nontrivial solution of Equation 10 can be obtained only if the determinant of the matrix is zero, as expressed in Equation 11.

$$x_{\xi\xi} y_{\eta\eta} - x_{\eta\eta} = 0 \qquad \text{Equation 11}$$

The matrix elements must be determined or specified. With four unknowns and two equations, two of the matrix elements must be specified unless all terms are set to zero. For example, grid distributions can be constructed such that only $x_{\xi\xi}$ and $x_{\eta\eta}$ are zero, satisfying Equation 11. In this case, $y_{\eta\eta}$ would be determined by Equation 9 with $y_{\xi\xi}$ specified (or vice versa). This would render part of the analysis closely coupled to the flow solver. The equations covering grid generation would then be as set forth in Equations 12 and 13.

$$x_{\xi\xi} = x_{\eta\eta} = 0 \qquad \text{Equation 12}$$

$$y_{\eta\eta} = -U/V \, y_{\xi\xi} \qquad \text{Equation 13}$$

Another approach leads to an algebraic set of grid equations, and involves setting all grid derivatives to zero, as set forth in Equation 14.

$$x_{\xi\xi} = x_{\eta\eta} = y_{\xi\xi} = y_{\eta\eta} = 0 \qquad \text{Equation 14}$$

Integration of $x_{\xi\xi}$ leads to the generic form of the solution in $\xi$ as set forth in Equation 15.

$$x_1(\xi, \eta) = \frac{F_1(\eta)(\xi - 1)^2}{2} + F_2(\eta)(\xi - 1) + F_3(\eta) \quad \text{Equation 15}$$

In Equation 15, $F_1(\eta)$, $F_2(\eta)$, and $F_3(\eta)$ are functions of $\eta$ only. Note that the quantity $(\xi-1)$ is used in place of $\xi$ with no loss in generality. Integrating $x_{\eta\eta\eta}$, the generic form in is set forth in Equation 16.

$$x_2(\xi, \eta) = \frac{G_1(\xi)(\eta - 1)^2}{2} + G_2(\xi)(\eta - 1) + G_3(\xi) \quad \text{Equation 16}$$

Equations 15 and 16 represent a family of $\eta$ and $\xi$ curves. Each family has three 'constants' of integration, all of which can be determined from the boundary conditions listed in Table 1 for an arbitrary grid. The last condition consists of either specifying orthogonality at the left boundary or specifying a curve interior to the grid. Equations are set forth below for both conditions.

TABLE 1

| Computational Coordinates | Physical Coordinates |
|---|---|
| At $\xi=1$, $1 \leq \eta \leq KMAX$ | $x=x_L(\eta)$, $y=y_L(\eta)$ |
| At $\xi=JMAX$, $1 \leq \eta \leq KMAX$ | $x=x_R(\eta)$, $y=y_R(\eta)$ |
| At $\eta=1$, $1 \leq \xi \leq JMAX$ | $x=x_B(\xi)$, $y=y_B(\xi)$ |
| At $\eta=KMAX$, $1 \leq \xi \leq JMAX$ | $x=x_T(\xi)$, $y=y_T(\xi)$ |
| At $\eta=1$, $1 \leq \xi \leq JMAX$ (condition of orthogonality imposed at the Bottom boundary) | $\frac{\partial x}{\partial \eta} = \frac{-\Delta S \cdot y'_B}{[(x'_B)^2 + (y'_B)^2]^{1/2}}$, $\frac{\partial y}{\partial \eta} = \frac{\Delta S \cdot x'_B}{[(x'_B)^2 + (y'_B)^2]^{1/2}}$ |
| At $\xi=1$, $1 \leq \eta \leq KMAX$ (condition of orthogonality imposed at the Left boundary) or | $\frac{\partial x}{\partial \xi} = \frac{\Delta N \cdot y'_L}{[(x'_L)^2 + (y'_L)^2]^{1/2}}$, $\frac{\partial y}{\partial \xi} = \frac{-\Delta N \cdot x'_L}{[(x'_L)^2 + (y'_L)^2]^{1/2}}$ |
| At $\xi=\xi_M$, $1 \leq \eta \leq KMAX$, where $1 < \xi_M < JMAX$ (specified interior line) | $x=x_M(\xi_M)$, $y=y_M(\xi_M)$ |

The subscripts L, R, B, and T for x and y correspond to the Left, Right, Bottom, and Top of the grid as illustrated in FIG. 1. Indices $(\xi,\eta)=(1,1)$ correspond to the point at which the Left and Bottom boundaries meet. Also note that $x_B' \equiv dx_B(\xi)/d\xi$, $y_B' \equiv dy_B(\xi)/d\xi$, etc. The term $\Delta S$ specifies the distance of the first grid point off the wall. Evaluating the constants in Equations 15 and 16 with the generic boundary conditions listed in Table 1, and imposing the orthogonality condition at the left boundary, leads to Equations 17 and 18.

$$x_1(\xi, \eta) = \left[\frac{\xi - 1}{JMAX - 1}\right]^2 x_R(\eta) + \left[1 - \left(\frac{\xi - 1}{JMAX - 1}\right)^2\right] x_L(\eta) + \quad \text{Equation 17}$$
$$\frac{\Delta N \cdot y'_L}{[(x'_L)^2 + (y'_L)^2]^{1/2}} (\xi - 1)\left[1 - \left(\frac{\xi - 1}{JMAX - 1}\right)\right]$$

$$x_2(\xi, \eta) = \left[\frac{\eta - 1}{KMAX - 1}\right]^2 x_T(\xi) + \left[1 - \left(\frac{\eta - 1}{KMAX - 1}\right)^2\right] x_B(\xi) - \quad \text{Equation 18}$$
$$\frac{\Delta S \cdot y'_B}{[(x'_B)^2 + (y'_B)^2]^{1/2}} (\eta - 1)\left[1 - \left(\frac{\eta - 1}{KMAX - 1}\right)\right]$$

The family of curves represented by Equations 17 and 18 can be combined to interpolate the entire region and form a computational mesh. The two equations are combined using Boolean Sum projectors. The final equation is given by Equation 19.

$$x(\xi, \eta) = x_1(\xi, \eta) + x_2(\xi, \eta) - \left[1 - \left(\frac{\eta - 1}{KMAX - 1}\right)^2\right] \quad \text{Equation 19}$$

$$\left\{\left[1 - \left(\frac{\xi - 1}{JMAX - 1}\right)^2\right] x_B(1) + \left[\frac{\xi - 1}{JMAX - 1}\right]^2 x_B(JMAX) + \right.$$
$$\left. (\xi - 1)\left[1 - \frac{\xi - 1}{JMAX - 1}\right] x'_B(1)\right\} - \left[\frac{\eta - 1}{KMAX - 1}\right]^2$$

$$\left\{\left[1 - \left(\frac{\xi - 1}{JMAX - 1}\right)^2\right] x_T(1) + \left[\frac{\xi - 1}{JMAX - 1}\right]^2 x_T(JMAX) + \right.$$
$$\left. (\xi - 1)\left[1 - \frac{\xi - 1}{JMAX - 1}\right] x'_T(1)\right\} -$$

$$(\eta - 1)\left[1 - \left(\frac{\eta - 1}{KMAX - 1}\right)\right] \cdot$$

$$\left\{\left[1 - \left(\frac{\xi - 1}{JMAX - 1}\right)^2\right] x'_L(1) + \left[\frac{\xi - 1}{JMAX - 1}\right]^2 x'_R(JMAX) + \right.$$

-continued $$\left. (\xi - 1)\left[1 - \frac{\xi - 1}{JMAX - 1}\right] \frac{\partial}{\partial \eta}\left[\frac{\partial x_L}{\partial \eta}\right]_{\xi=\eta=1}\right\}$$

The analysis for y leads to Equations 20 and 21.

$$y_1(\xi, \eta) = \left(\left[\frac{\xi - 1}{JMAX - 1}\right]\right)^2 y_R(\eta) + \left[1 - \left(\frac{\xi - 1}{JMAX - 1}\right)^2\right] y_L(\eta) + \quad \text{Equation 20}$$
$$\frac{-\Delta N \cdot x'_L}{([(x'_L)^2 + (y'_L)^2])^{1/2}} (\xi - 1)\left[1 - \left(\frac{\xi - 1}{JMAX - 1}\right)\right]$$

$$y_2(\xi, \eta) = \quad \text{Equation 21}$$
$$\left(\left[\frac{\eta - 1}{KMAX - 1}\right]\right)^2 y_T(\xi) + \left[1 - \left(\frac{\eta - 1}{KMAX - 1}\right)^2\right] y_B(\xi) +$$
$$\frac{\Delta S \cdot x'_B}{([(x'_B)^2 + (y'_B)^2])^{1/2}} (\eta - 1)\left[1 - \left(\frac{\eta - 1}{KMAX - 1}\right)\right]$$

Combining Equations 20 and 21 using Boolean Sum projectors yields Equation 22.

$$y(\xi, \eta) = y_1(\xi, \eta) + y_2(\xi, \eta) - \left[1 - \left(\frac{\eta - 1}{KMAX - 1}\right)^2\right] \quad \text{Equation 22}$$

-continued $$\left\{\left[1-\left(\frac{\xi-1}{JMAX-1}\right)^2\right]y_B(1)+\left[\frac{\xi-1}{JMAX-1}\right]^2 y_B(JMAX)+\right.$$

$$(\xi-1)\left[1-\frac{\xi-1}{JMAX-1}\right]y_B'(1)\right\}-\left[\frac{\eta-1}{KMAX-1}\right]^2$$

$$\left\{\left[1-\left(\frac{\xi-1}{JMAX-1}\right)^2\right]y_T(1)+\left[\frac{\xi-1}{JMAX-1}\right]^2 y_T(JMAX)+\right.$$

$$(\xi-1)\left[1-\frac{\xi-1}{JMAX-1}\right]y_T'(1)\right\}-$$

$$(\eta-1)\left[1-\left(\frac{\eta-1}{KMAX-1}\right)\right].$$

$$\left\{\left[1-\left(\frac{\xi-1}{JMAX-1}\right)^2\right]y_L'(1)+\left[\frac{\xi-1}{JMAX-1}\right]^2 y_R'(JMAX)+\right.$$

$$(\xi-1)\left[1-\frac{\xi-1}{JMAX-1}\right]\frac{\partial}{\partial\eta}\left[\frac{\partial y_L}{\partial\xi}\right]_{\xi=\eta=1}\right\}$$

Figure 2A:
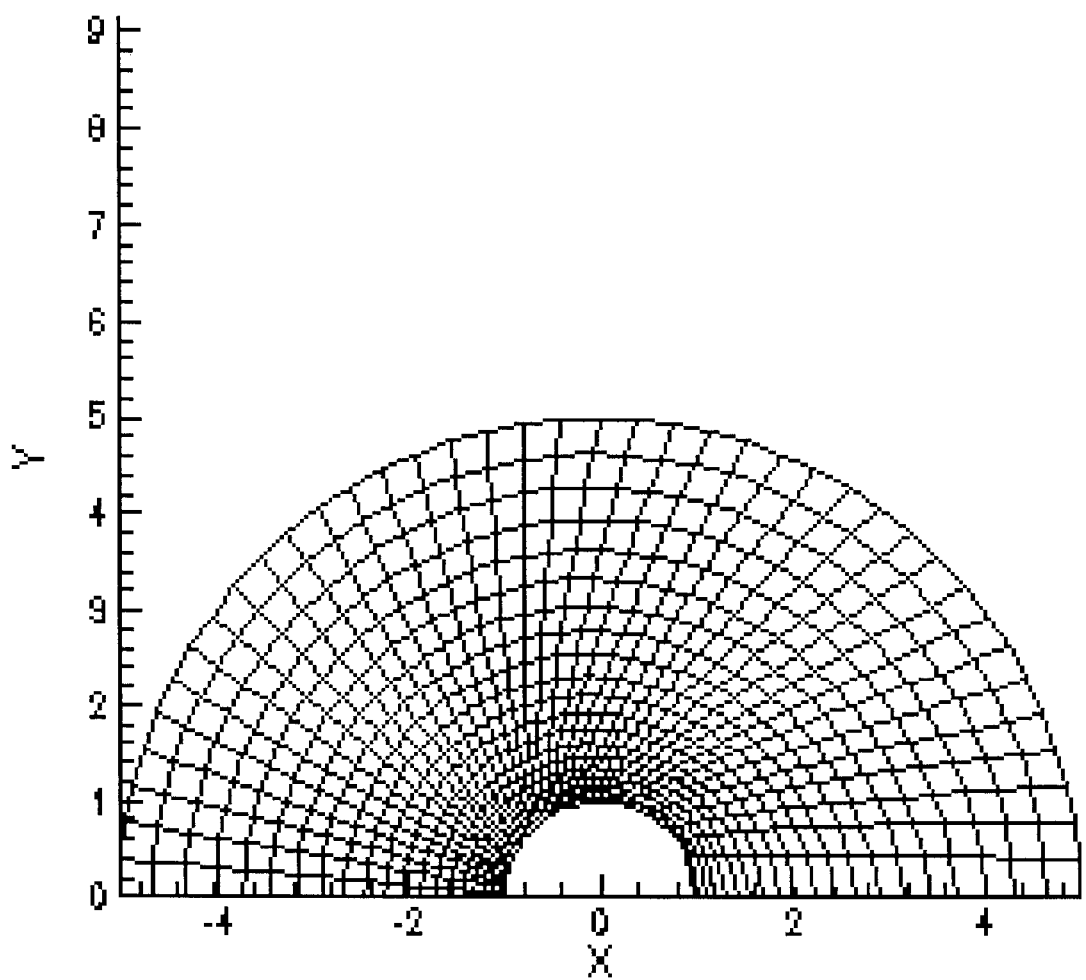
FIG. 2(a,b) is an example of a grid generated according to the present invention.
Figure 2B:
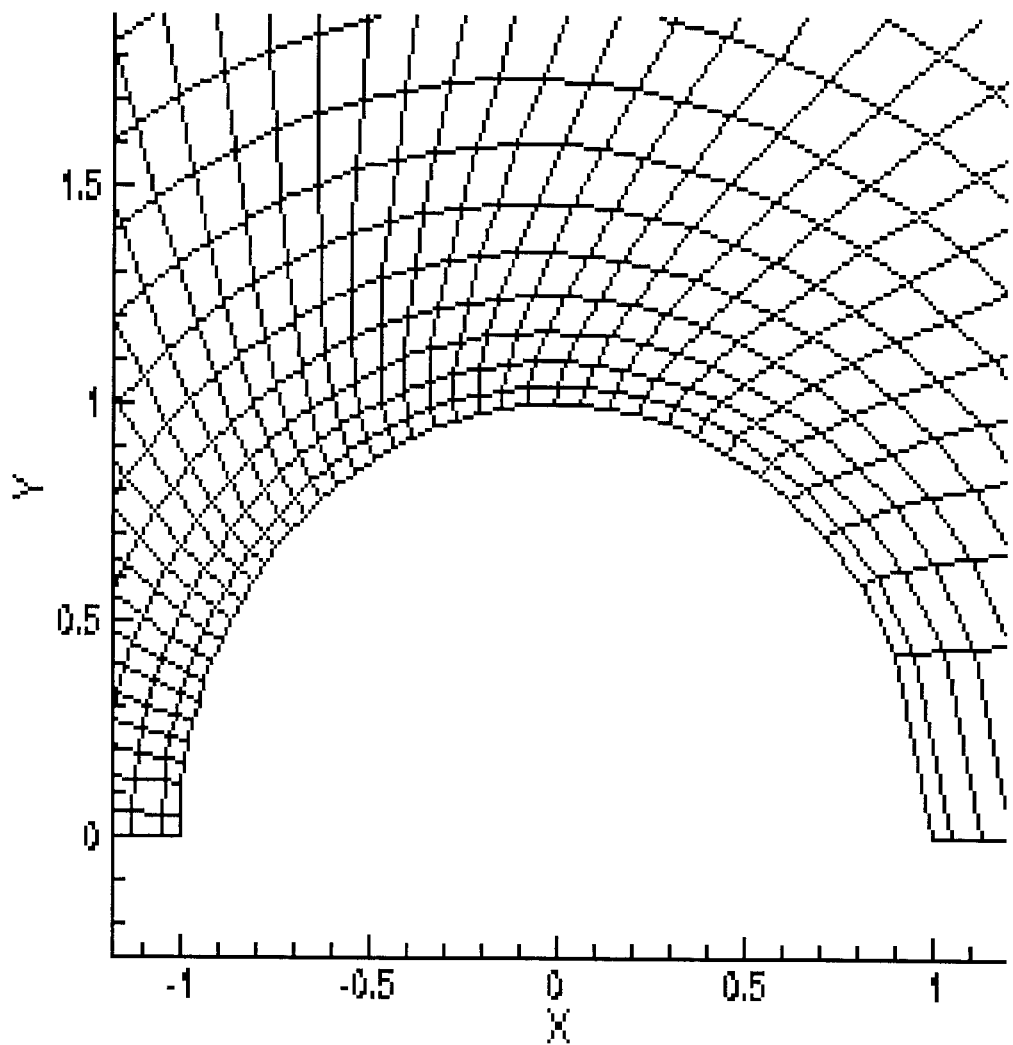
Figure 3A:
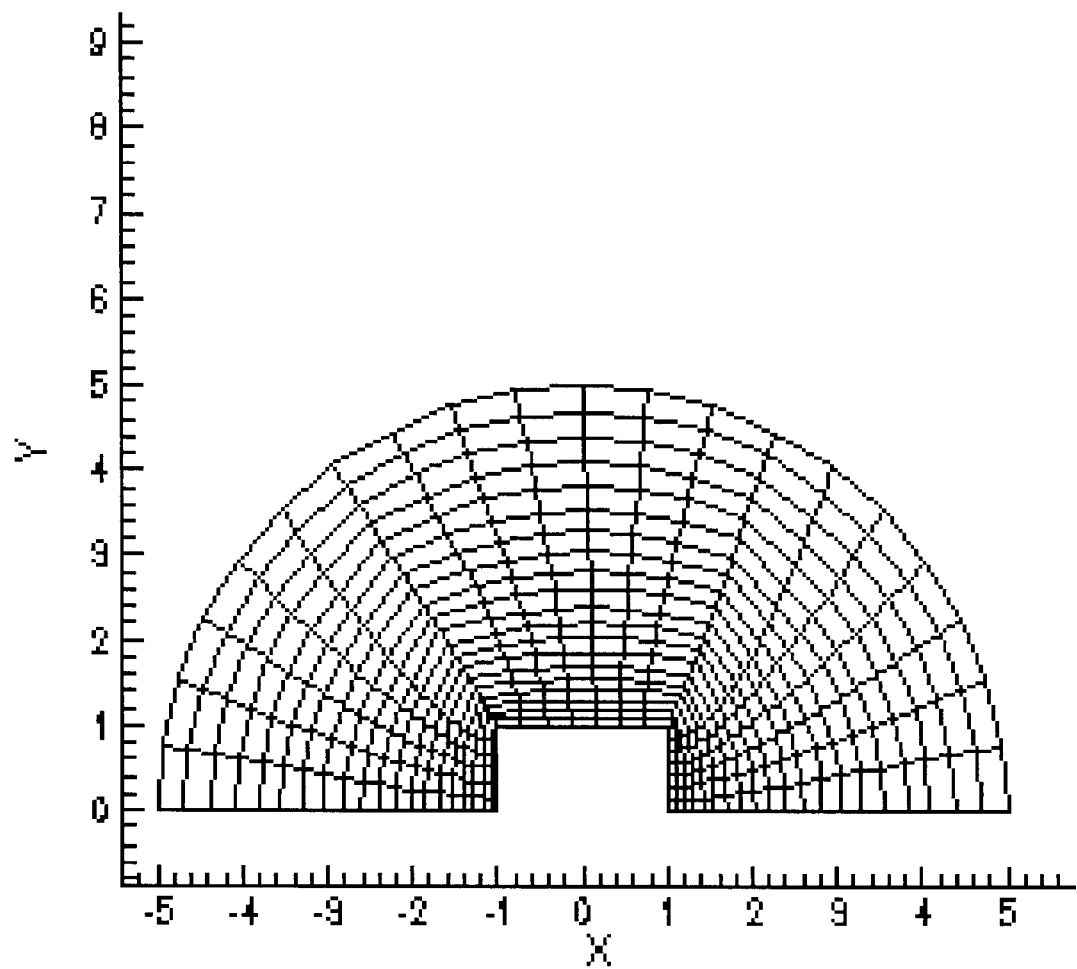
FIG. 3(a,b) is an example of a grid generated according to the present invention.
Figure 3B:
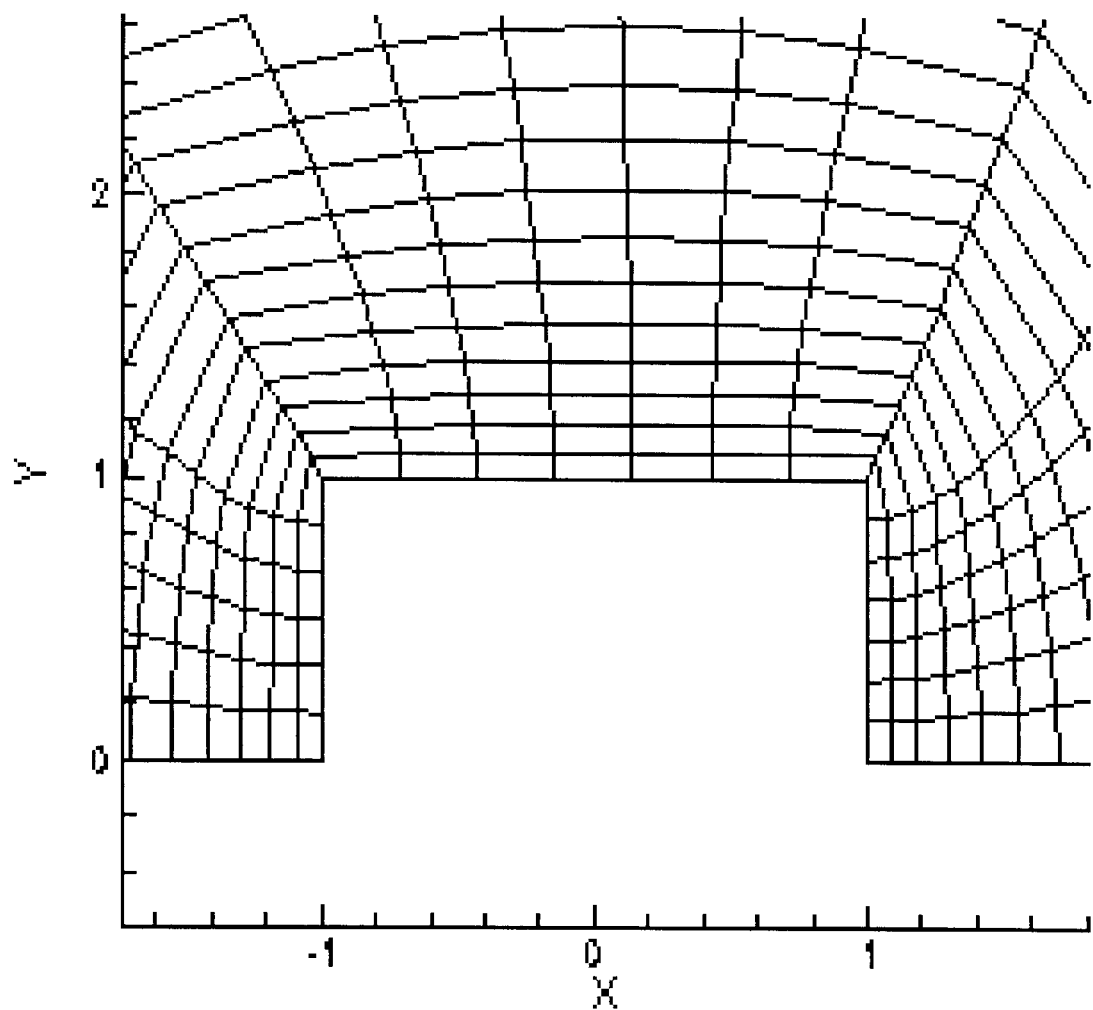

The above grid distribution ensures that $T_{E1}$ will be zero. FIGS. 2(a,b) and 3(a,b) show example grids generated according to the above expressions of the present invention.

Figure 4:
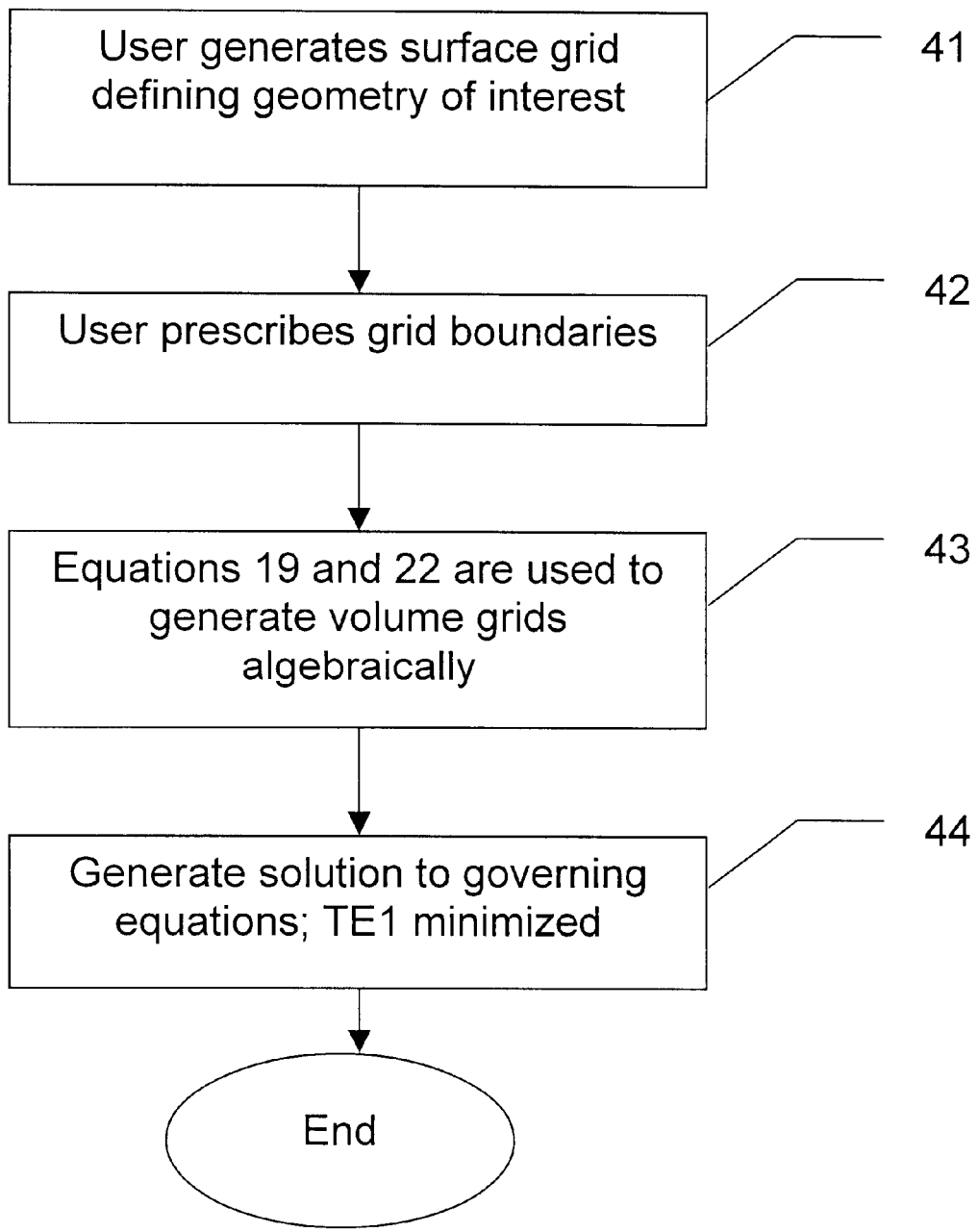
FIG. 4 is a flow diagram according to the present invention.

FIG. 4 is a flow diagram of a process according to the above expression of the present invention. The process begins with a definition of a surface grid defining the geometry of interest 41. The boundaries of the grid must be defined 42. Volume grid cells can then be generated algebraically 43 according to Equations 19 and 22. The governing relations can then be solved 44 using the surface and volume grids. Solution of the governing relations can converge more rapidly since the grid used does not introduce discretization errors.

Pseudocode that implements the above process for $T_{E1}=0$ is listed in Table 2. Detailed programming for specific computers starting from the pseudocode is known to those skilled in the art. Grids can be output using the well-known PLOT3D format. See, e.g. Walatka et al., "PLOT3D User's Manual," NASA Technical Memorandum 101067, March 1990. Grids can be visualized on a computer using any graphics program that reads in PLOT3D-formatted grids.

TABLE 2

This pseudocode outlines the process of generating a grid from the equations derived by setting $T_{E1}=0$. The grid so generated is an algebraic grid. The four edge curves must be defined as well as the spacing of the first point off the wall. The wall is assumed to be at eta=1 and is a function of xi.
dimension, parameter, and implicit statements; open input and output files.
perform any checks necessary to ensure grid fits within dimension statements mentioned above
call subroutines defining geometry and define boundaries of geometry of interest;
    call geometry
define x(j,k) and y(j,k) values along grid boundaries
    do j=1,jmaxg
        x(j,1)=xb(j);        y(j,1)=yb(j);        x(j,kmaxg)=xt(j); y(j,kmaxg)=yt(j)
    do k=1,kmaxg
        x(j,k)=xl(k);        y(1,k)=yl(k);        x(jmaxg,k)=xr(k); y(jmaxg,k)=yr(k)
calculate coefficients needed in grid equations. Note: jspec is the j value of the specified interior grid line
    fjspec=float(jspec)
    fac1=fjspec-1.;        fac2=fjmaxg-1.;        fac3=1.-fac2/fac1
    do 40 j=2,jmaxg-1
        xi=float(j)
        alpha1(j)=(1./(fac1*fac2*fac3) - (fac2/fac1)/(fac1**2.*fac3) - 1./fac1**2.)*(xi-1.)2. + ((fac2/fac1)2.-
            1.)/(fac2*fac3)*(xi-1.) + 1.
        alpha2(j)=(1./fac12. + (fac2/fac1)/(fac12.*fac3))*(xi-1.)2 - ((fac2/fac1)2./(fac2*fac3))*(xi-1.)
        alpha3(j)=-1./(fac1*fac2*fac3)*(xi-1.)**2 + 1./(fac2*fac3)*(xi-1.)
        phi1(j)=alpha1(j);        phi2(j)=alpha2(j);        phi3(j)=alpha3(j)
        continue
    do 45 k=2,kmaxg-1
        eta=float(k)
        factor=(eta-1.)/(fkmaxg-1.)
        beta1(k)=1.-factor2.;        beta2(k)=factor2.;        beta3(k)=(eta-1.)*(1.-factor)
        psi1(k)=beta1(k);        psi2(k)=beta2(k); psi3(k)=beta3(k)
        continue
form x and y by calculating the tensor product (Boolean Sum) projector
    pmag1=sqrt(xbp(1)2.+ybp(1)2.);        pmag2=sqrt(xbp(jmaxg)2.+ybp(jmaxg)2.)
    dsy1=-ds(1)*ybp(1)/pmag1;        dsy2=-ds(jmaxg)*ybp(jmaxg)/pmag2
    dsx1=+ds(1)*xbp(1)/pmag1;        dsx2=+ds(jmaxg)*xbp(jmaxg)/pmag2
    do 55 j=2,jmaxg-1
        pmag=sqrt(xbp(j)2.+ybp(j)2.)
        dsy=-ds(j)*ybp(j)/pmag;        dsx=+ds(j)*xbp(j)/pmag
        do 55 k=2,kmaxg-1
form of interior grid points
        xfactor1=alpha1(j)*xb(1)+alpha2(j)*xb(jspec)+alpha3(j)*xb(jmaxg)
        xfactor2=alpha1(j)*xt(1)+alpha2(j)*xt(jspec)+alpha3(j)*xt(jmaxg)
        xfactor3=alpha1(j)*xlp(1)+alpha2(j)*xmp(1)+alpha3(j)*xrp(1)
        x1=beta1(k)*xfactor1;        x2=beta2(k)*xfactor2;        x3=beta3(k)*xfactor3
        xx=x1+x2+x3
        x(j,k)=alpha1(j)*xl(k)+alpha2(j)*xm(k)+alpha3(j)*xr(k)+beta1(k)*xb(j)+beta2(k)*xt(j)+beta3(k)*dsy-zz
form y value of interior grid points
        yfactor1=phi1(j)*yb(1) +phi2(j)*yb(jspec) +phi3(j)*yb(jmaxg)
        yfactor2=phi1(j)*yt(1) +phi2(j)*yt(jspec) +phi3(j)*yt(jmaxg)
        yfactor3=phi1(j)*ylp(1)+phi(j)*ymp(1) +phi3(j)*yrp(1)
        y1=psi1(k)*yfactor1;        y2=psi2(k)*yfactor2;        y3=psi3(k)*yfactor3
        yy=y1+y2+y3

TABLE 2-continued

```
           y(j,k)= phi1(j)*yl(k)+phi2(j)*ym(k)+phi3(j)*yr(k)+psi1(k)*yb(j)+psi2(k)*yt(j) +psi3(k)dsx-yy
continue
print out results, output grid in plot3d format, finished
subroutine geometry()
define grid size:              jmaxg, kmaxg,        top of grid defined as:        xt(j), yt(j)
leftside of grid defined as:   xl(k), yl(k);        right side of grid defines as: xr(k), yr(k)
bottom of grid defines as:     xb(j), yb(j),        derivative of bottom grid line: xbp(j), ybp(j)
first grid point spacing off wall: ds(j)
```

Grid Generation so $T_{E1}=0$

Grid generation equations that drive $T_{E2}$ to zero can be derived similarly to those for driving $T_{E1}$ to zero. The analysis can be significantly more complicated since $T_{E2}$ contains more derivatives and a cross derivative term. The derivation below focuses on arriving at equations for a grid distribution that are dependent on the flow solution, hence coupling the flow solver with the grid generation.

Rearranging Equation 7 to have factors that multiply the contravariant velocity terms U and V yields Equation 23.

$$U[x_\xi x_{\xi\xi} f_{xx}+(y_\xi x_{\xi\xi}+x_\xi y_{\xi\xi})f_{xy}+y_\xi y_{\xi\xi} f_{yy}]+V[x_\eta x_{\eta\eta} f_{xx}+(y_\eta x_{\eta\eta}+x_\eta y_{\eta\eta})f_{xy}+y_\eta y_{\eta\eta} f_{yy}] \quad \text{Equation 23}$$

Setting the coefficients of U and V to zero and rearranging yields equations 24 and 25.

$$(x_\xi f_{xx}+y_\xi f_{xy})x_{\xi\xi}+(x_\xi f_{xy}+y_\xi f_{yy})y_{\xi\xi}=0 \quad \text{Equation 24}$$

$$(x_\eta f_{xx}+y_\eta f_{xy})x_{\eta\eta}+(x_\eta f_{xy}+y_\eta f_{yy})y_{\eta\eta}=0 \quad \text{Equation 25}$$

Setting the coefficients to zero in Equation 24 yields Equations 26 and 27.

$$x_\xi f_{xx}+y_\xi f_{xy}=0 \quad \text{Equation 26}$$

$$x_\xi f_{xy}+y_\xi f_{yy}=0 \quad \text{Equation 27}$$

Multiplying Equation 26 by $x_\xi$, Equation 27 by $y_\xi$, and subtracting removes the cross derivative term, as in Equation 28.

$$x_\xi^2 f_{xx}-y_\xi^2 f_{yy}=0 \quad \text{Equation 28}$$

An analogous result for Equation 25 is shown in Equation 29.

$$x_\eta^2 f_{xx}-y_\eta^2 f_{yy}=0 \quad \text{Equation 29}$$

Equation 30 shows the matrix form.

$$\begin{bmatrix} x_\xi^2 & -y_\xi^2 \\ x_\eta^2 & -y_\eta^2 \end{bmatrix} \begin{Bmatrix} f_{xx} \\ f_{yy} \end{Bmatrix} = \begin{Bmatrix} 0 \\ 0 \end{Bmatrix} \quad \text{Equation 30}$$

Setting the determinant of the matrix to zero gives a non-trivial solution, as shown in Equation 31. In Equation 31, J is the Jacobian in Equation 2.

$$x_\xi^2 y_\eta^2 - x_\eta^2 y_\xi^2 = (x_\xi y_\eta + x_\eta y_\xi)(x_\xi y_\eta - x_\eta y_\xi) = (x_\xi y_\eta + x_\eta y_\xi)J = 0 \quad \text{Equation 31}$$

Further analysis of the above equations allows solution for $x_{\xi\eta}$ and $y_{\xi\eta}$, as in Equations 32 and 33. A detailed exposition of the analysis is given by Barnette in "A Mathematical Basis for Automated Structured Grid Generation with Close Coupling to the Flow Solver," AIAA 16th Applied Aerodynamics Conference, 1998, incorporated herein by reference.

$$x_{\xi\eta}=\Psi_1 x_\xi+\Psi_2 x_\eta \quad \text{Equation 32}$$

$$y_{\xi\eta}=\Psi_1 y_\xi+\Psi_2 y_\eta \quad \text{Equation 33}$$

In Equations 32 and 33 the velocity derivatives are expressed in computational space, and the coefficients represented by $\Psi$ are given by Equations 34 and 35.

$$\Psi_1 = \frac{v_\eta u_{\xi\eta} - u_\eta v_{\xi\eta}}{v_\eta u_\xi - u_\eta v_\xi} \quad \text{Equation 34}$$

$$\Psi_2 = \frac{v_{\xi\eta} u_\xi - u_{\xi\eta} v_\xi}{v_\eta u_\xi - u_\eta v_\xi} \quad \text{Equation 35}$$

If only Equations 32 and 33 equations are considered, it must be assumed that some initial grid points close to the geometry of interest are supplied, for example by a user. An initial solution can obtained on this partial grid. Equations 32 and 33 are known to be hyperbolic, $2^{nd}$-order, linear partial differential equations with variable coefficients. These equations may be finite differenced to provide equations for predicting the next layer of grid points as determined by the velocity gradients of the initial solution. By iterating back and forth between the grid generation algorithm, which adds more grid point layers, and the solution of the governing equations, which provides updated velocity gradients for the variable coefficients of Equations 32 and 33, computational grids can be generated simultaneously with the solution. This method of grid construction ensures accuracy by annihilating the dominant convective truncation error terms.

Figure 5:
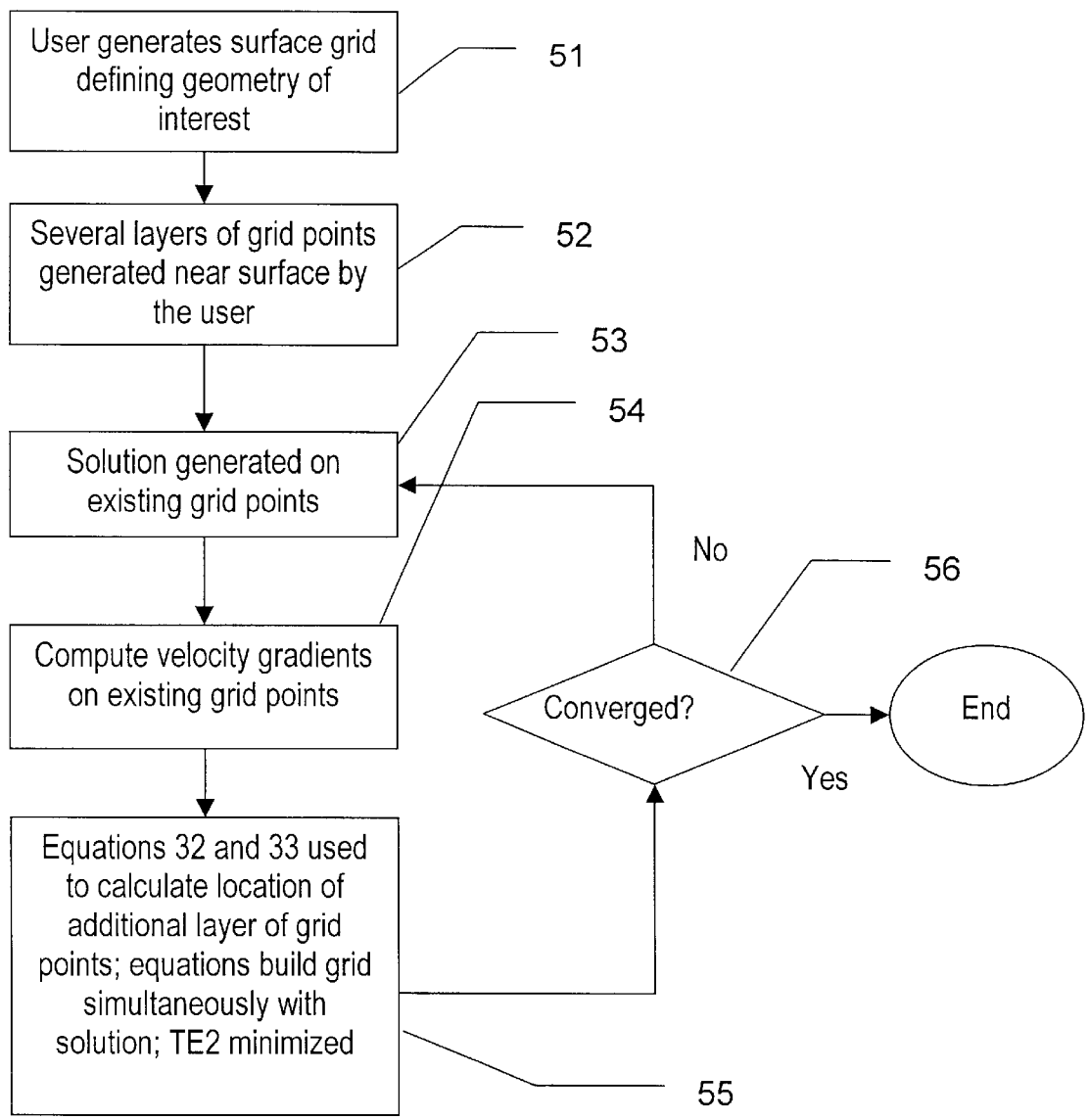
FIG. 5 is a flow diagram according to the present invention.

FIG. 5 is a flow diagram of a process according to the above expression of the present invention. A surface grid defining the geometry of interest is known, for example by definition by a user 51. Initial volume grid cells near the surface are generated, for example by definition by a user 52 or according to the $T_{E1}$ expression of the present invention as described above. An initial solution of the governing relations can then be generated using the initial volume grid cells 53. Velocity gradients on the existing grid cells can then be determined 54. Additional layers of grid cells can then be determined from the velocity gradients and Equations 32 and 33. The above process can be repeated until a desired terminal condition is reached, for example until a solution to the governing relations converges 56. The iterative solution-grid construction process can encourage faster, more accurate solution by minimizing $T_{E2}$ truncation errors.

Pseudocode that implements the above process for $T_{E2}=0$ is listed in Table 3. Detailed programming for specific computers starting from the pseudocode is known to those skilled in the art. Grids can be output using the well-known PLOT3D format. See, e.g. Walatka et al., "PLOT3D User's Manual," NASA Technical Memorandum 101067, March 1990. Grids can be visualized on a computer using any graphics program that reads in PLOT3D-formatted grids.

TABLE 3

This pseudocode generates a grid such that TE2=0 in the higher-order convective truncation such that these error
terms will be zero.
dimension, parameter, and common statements go here

| | |
|---|---|
| call read_grid | read in initial grid (plot3d format) |
| call read_q | read in initial solution (plot3d format) |
| call metrics | call routine to calculate grid metrics |
| call q_derivatives | call routine to calculate velocity derivatives |
| call vel12_factors | form the ratios of velocity derivatives | solve Eqs. 32 and 33 IMPLICITLY; determine grid points using Te2=0 analysis using IMPLICIT step; one more new
line of points will be generated, such that x_new, y_new are dimensioned (jmaxg,kmaxg+1)
call grid_gen
call redistribute                      redistribute the new points generated in grid_gen, according to Te1=0, if desired
solve Eqs. 32 and 33 EXPLICITLY determine grid points using Te2=0 analysis using EXPLICIT step; one more new
line of points will be generated, such that x_new, y_new are dimensioned (jmaxg,kmaxg+1)
call explicit_solve

| | |
|---|---|
| call tolerance(tol) | calculate tolerance to see how grid is growing |
| call add_grid_points | add grid points to top of grid |
| call write_grid | print out new grid and solution file in plot3d format |
| call write_q | | iterate if necessary

| | |
|---|---|
| subroutine read_grid | read initial grid next to geometry |
| subroutine read_q | read in velocity values on initial grid |
|    parameter(jmax=55,kmax=10) | |
| subroutine metrics | calculate grid metrics |
| subroutine q_derivatives | calculate velocity derivatives needed in grid equations |
| subroutine vel12_factors | form the ratios of velocity derivatives |
| subroutine grid_gen | generate new layer of grid points implicitly | dimension and parameter statements go here do 5 j=1,jmaxg                         redefine previous values from x_old to x_new
   x_new(j,1)=x_old(j,1)
   y_new(j,1)=y_old(j,1)
5    continue
solve for x_new by marching outward according to equation for x_xi_eta (Eq. 32)
fill up matrix A for Ax=b, where elements of A are a(j,k), b(j,k), and c(j,k); will do line inversion in j-direction, so loop
first on k
do 20 k=2,kmaxg
vel1_factor() corresponds to psi_1 in Eqs. 32 and 33
vel2_factor() corresponds to psi_2 in Eqs. 32 and 33
left boundary
if(vel1_factor(1,k).eq.'undefined') then
   xnum=veta(1,k)*uetaxi(1,k)-ueta(1,k)*vetaxi(1,k)
   xdenom=uxi(1,k)*vetaxi(1,k)-vxi(1,k)*uetaxi(1,k)
   if(xdenom.eq.0.) then
      d(1)=1.;            a(1)=0.;            c(1)=x_new(1,k)
   else
      d(1)=1.;            a(1)=0.
      c(1)=x_new(1,k−1)-2.*(xnum/xdenom)*(x_new(2,k)-x_new(1,k))
   endif
else
   d(1)=-(1.+vel2_factor(1,k))
   a(1)=1.
   c(1)=2.*vel1_factor(1,k)*(x_new(2,k)-x_new(1,k))
   1 − (1.+vel2_factor(1,k))*x_new(1,k−1)+x_new(2,k−1)
endif
interior points
lo 10 j=2,jmaxg-1
   if(vel1_factor(j,k) .eq.'undefined') then
      xnum=veta(j,k)*uetaxi(j,k)-ueta(j,k)*vetaxi(j,k)
      xdenom=uxi(j,k)*vetaxi(j,k)-vxi(j,k)*uetaxi(j,k)
      if(xdenom.eq.0.) then
         b(j)=0.;        d(j)=1.;        a(j)=0.;        c(j)=x_new(j,k)
      else
         b(j)=0.;        d(j)=1.;        a(j)=0.
         c(j)=x_new(j,k−1)-(xnum/xdenom)*(x_new(j+1,k)-x_new(j−1,k))
      endif
   else
      b(j)=-1.;        d(j)=-2.*vel2_factor(j,k);        a(j)=1.
      c(j)2.*vel1_factor(j,k)*(x_new(j+1,k)-x_new(j−1,k))-_new(j−1,k−1)-2.*vel2_factor(j,k)*x_new(j,k−1)+x_new(j+1,k−1)
   endif
10   continue
right boundary
if(vel1_factor(jmaxg,k).eq.'undefined') then
   xnum=veta(mjaxg,k)*uetaxi(jmaxg,k)-ueta(jmaxg,k)*vetaxi(jmaxg,k)
   xdenom=uxi(jmaxg,k)*vetaxi(jmaxg,k)-vxi(jmaxg,k)*uetaxi(jmaxg,k)
   if(xdenom.eq.0.) then
      b(jmaxg)=0.;        d(jmaxg)=1.        c(jmaxg)=x_new(jmaxg,k)
   else
      b(jmaxg)=0.;        d(jmaxg)=1.
      c(jmaxg)=x_new(jmaxg,k−1)-2.*(xnum/xdenom)*(x_new(jmaxg,k)-x_new(jmaxg-1,k))

TABLE 3-continued

```
    endif
else
    b(jmaxg)=-1.
    d(jmaxg)=1 .-vel2_factor(jmaxg,k)
    c(jmaxg,k))=2.*vel1_factor(jmaxg,k)*(x_new(jmaxg,k)-x_new(jmaxg-1,k))-x_new(jmaxg-1,k-1)+(1.-
    vel2_factor(jmaxg,k))*x_new(jmaxg,k-1)
endif
call matrix solver for Ax=b
call matrix_solver
solution vector c contains new x values for this k=constant line, corresponding to an additional layer of grid points
do j=1,jmaxg:        x_new(j,k+1)=c(j)
20  continue
solve for y_new by marching outward according to equation for y_xi_eta (Eq. 33) in the same way as x_new above
subroutine redistribute              redistribute grid points to ensure TE1=0, if desired
subroutine explicit_solve            generate new layer of grid points explicitly
same idea as subroutine grid_gen but explicit step used to advance grid
subroutine tolerance(tol)            calculate difference between old and new grid
subroutine add_grid_points           simply add new top layer of grid points to old grid
subroutine write_grid                write grid values to file
subroutine write_q                   write the velocities to file
```

Grid Generation so $T_{E1}=T_{E2}=0$

The convection truncation error analyses above provide equations that can be used for automated grid generation. One set of equations for constructing grids is uncoupled from the flow solver; the other set, coupled. This permits an initial grid to be generated that ensures the leading convection truncation error term is zero. The initial grid is assumed to be of minimal construction and rather arbitrarily placed, with for example five grid points off the wall. Once a flow solver has been run on the initial grid for several time steps and possibly some prominent features of the flow have begun to emerge, the non-converged solution can be fed into the coupled grid generation equations to intelligently redistribute the grid points and possibly enhance flow field convergence. This redistribution ensures the second leading truncation error term to be zero. A layer of grid points can then be added to the previous outer layer of grid points, the process of which is discussed below. The algorithm then iterates between the flow solver and the grid construction until the flow solver indicates convergence and no more outer-layer grid points need be added.

The process of intelligently adding more grid points to the previous grid's outer layer is the method by which the grid is constructed or, perhaps more appropriately, built up. This allows the user to begin the flow solution with nothing more than the surface grid describing the geometry about which the flow field is to be calculated, and an initial coarse grid rather arbitrarily constructed with the use of algebraic methods such as those given by Equations 19 and 22. The equations used to construct, or add, the new outer layer are given by Equations 32 and 33. These equations are hyperbolic. A proper finite difference stencil allows the equations to predict a grid level, i.e. the new outer level, above those points at which the velocities and their gradients have been determined from the previous iteration. Development of this process is straightforward to those skilled in the art or may be learned by practice of the invention.

Figure 6:
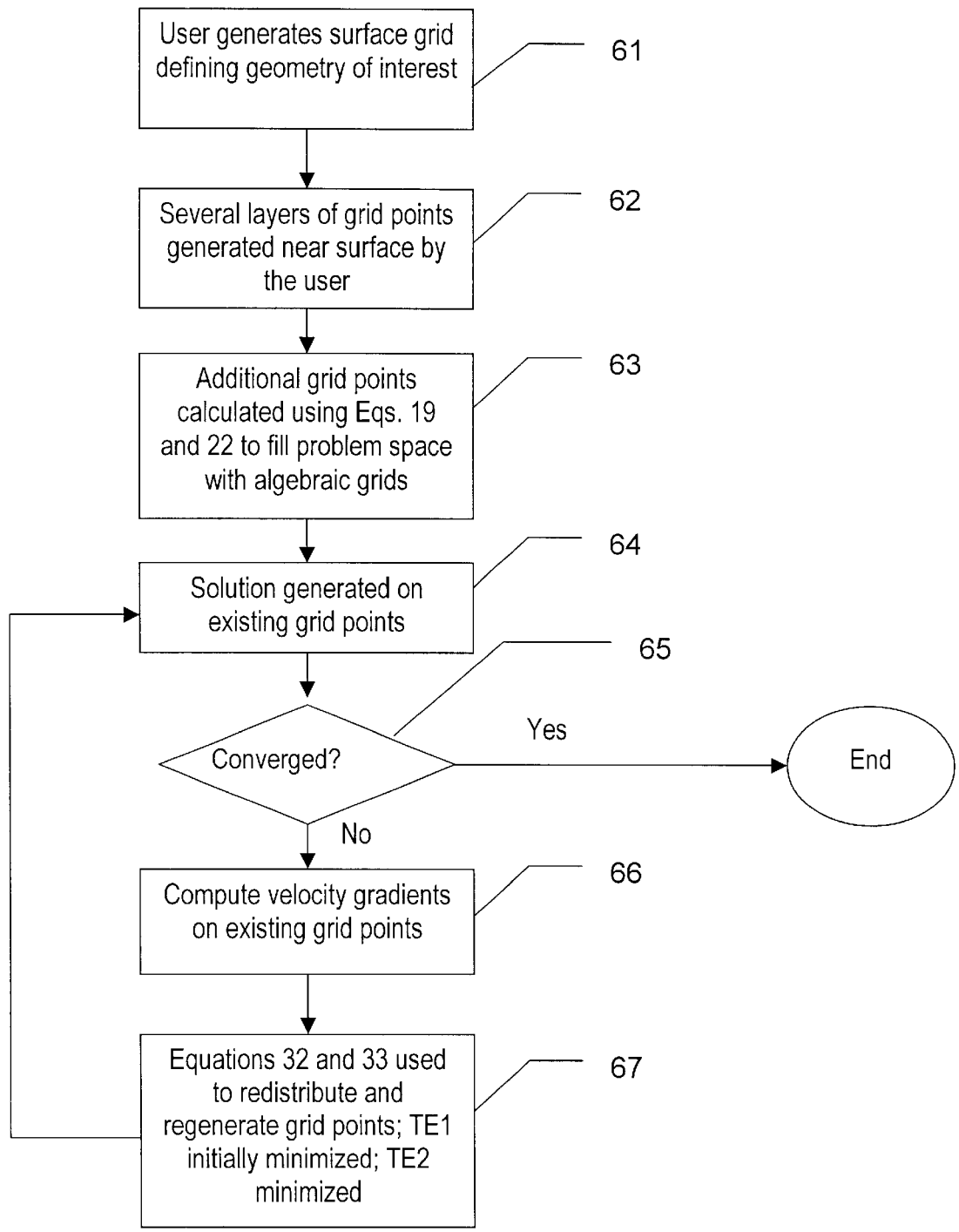
FIG. 6 is a flow diagram according to the present invention.

FIG. 6 is a flow diagram of a process according to the above expression of the present invention. A surface grid defining the geometry of interest is known, for example by definition by a user 61. Initial volume grid cells near the surface are generated, for example by definition by a user 62. Additional grid points can then be determined 63 according to the present invention (as expressed in Equations 19 and 22). Determining the additional grid points according to Equations 19 and 22 ensures that $T_{E1}=0$, thereby minimizing errors introduced by discretization. An initial solution of the governing relations can then be generated using the initial volume grid cells 64. If the solution has not yet converged, then velocity gradients on the existing grid cells can then be determined 66. Additional layers of grid cells can then be determined 67 from the velocity gradients and Equations 32 and 33. The above process can be repeated until a desired terminal condition is reached, for example until a solution to the governing relations converges 65. The iterative solution-grid construction process can encourage faster, more accurate solution by minimizing $T_{E2}$ truncation errors.

Apparatus

Figure 7A:
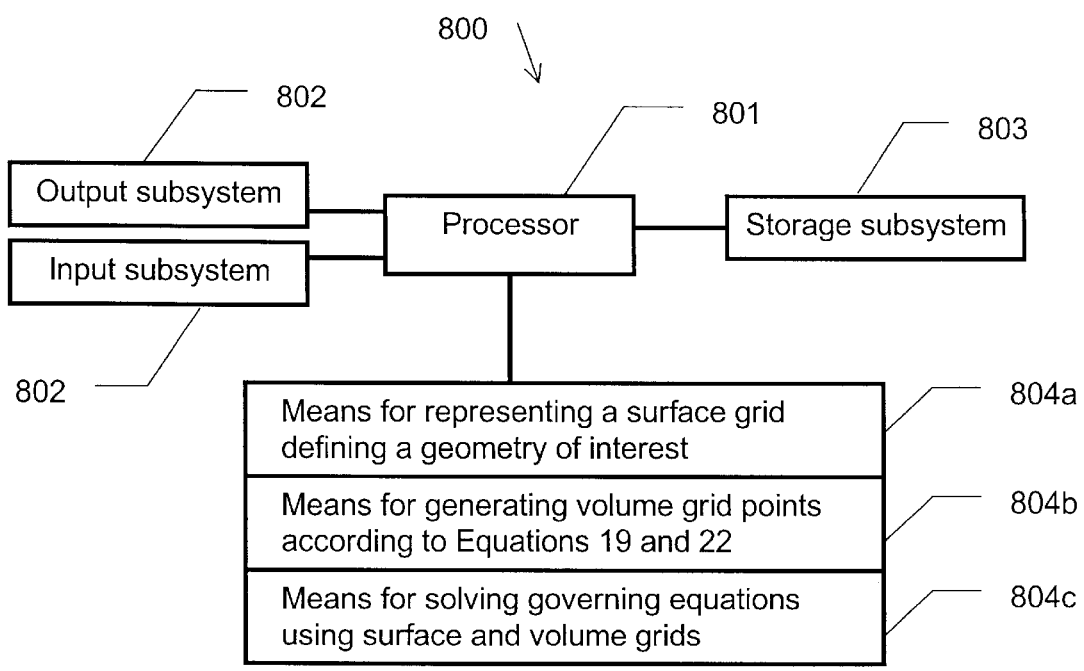
FIG. 7a is a diagram of an apparatus according to the present invention.

The present invention also comprises apparatus adapted to practice the method described above. FIG. 7a shows an apparatus 800 according to the present invention. A processor 801 connects with an input/output subsystem 802 and storage subsystem 803. Apparatus 800 also comprises means for representing, in storage subsystem 803, a representation of a surface grid defining the geometry of interest 804a, means for generating volume grid points 804b according to Equations 19 and 22, and means for solving the governing equations using the surface and volume grids 804c. For example, processor 800 can comprise a workstation such as contemporary workstations from Sun, IBM, HPUX, and Silicon Graphics, with local storage such as disk and semiconductor memory, input/output such as a keyboard, display, and network connection. The means for representing, in storage subsystem 803, a representation of a surface grid defining the geometry of interest 804a, means for generating volume grid points 804b according to Equations 19 and 22, and means for solving the governing equations using the surface and volume grids 804c, can comprise computer software, hardware, network downloads, or combinations thereof. Apparatus 800 can also comprise a multiprocessor computer such as the Intel Paragon.

Figure 7B:
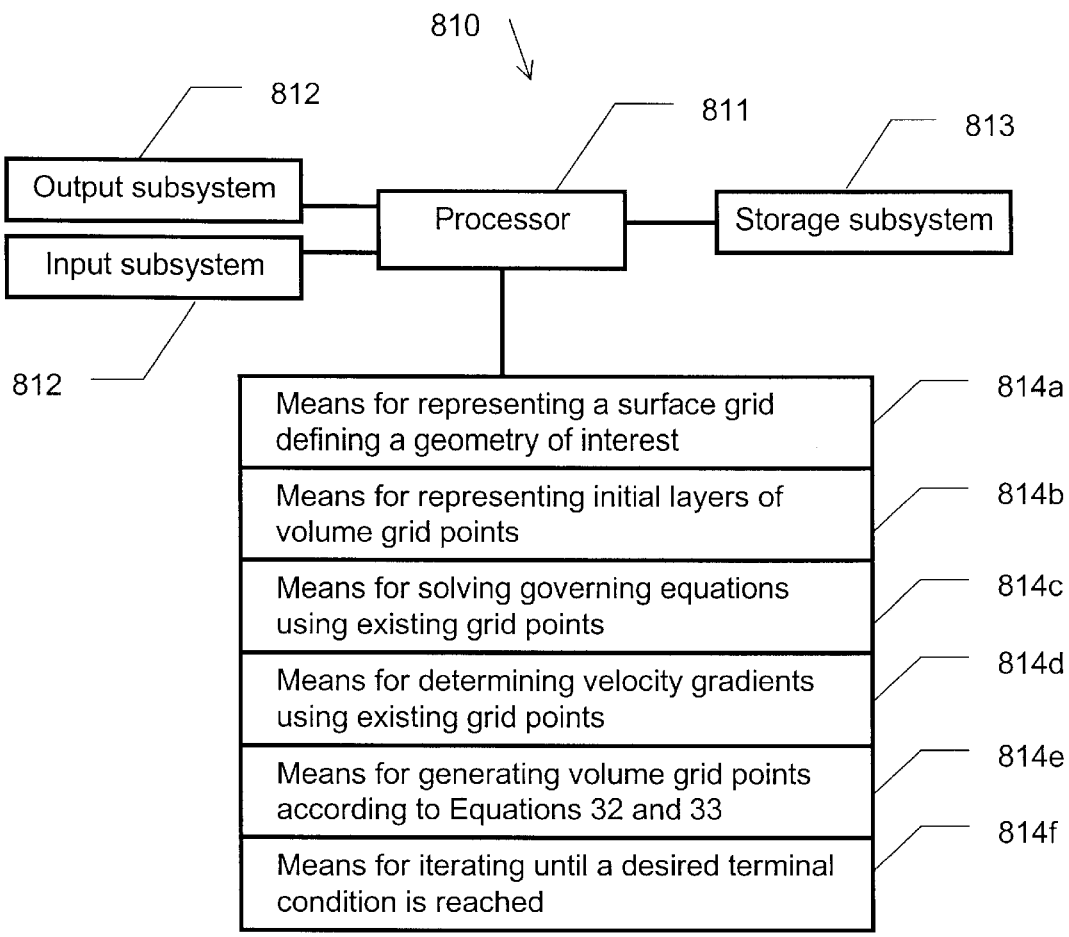
FIG. 7b is a diagram of an apparatus according to the present invention.

FIG. 7b shows an alternate apparatus 810 according to the present invention. A processor 811 connects with an input/output subsystem 812 and storage subsystem 813. Apparatus 810 also comprises means for representing, in storage subsystem 813, a representation of a surface grid defining the geometry of interest 814a, means for representing, in storage subsystem 813, a representation of initial layers of volume grid points 814b, means for solving the governing equations using existing grid points 814c, means for determining velocity gradients using existing grid points 814d, means for generating volume grid points 814e according to Equations 32 and 33, and means for iterating until a desired terminal condition is reached 814f. For example, processor 810 can comprise a workstation such as contemporary workstations from Sun, IBM, HPUX, and Silicon Graphics, with local storage such as disk and semiconductor memory, input/output such as a keyboard, display, and network connection. The means for representing, in storage subsystem 813, a representation of a surface grid defining the geometry of interest 814a, means for representing, in storage subsystem 813, a representation of initial layers of volume grid points 814b, means for solving the governing equations using existing grid points 814c, means for determining velocity gradients using existing grid points 814d, means for generating volume grid points 814e according to Equations 32 and 33, and means for iterating until a desired terminal condition is reached 814f, can comprise computer software, hardware, network downloads, or combinations thereof. Apparatus 810 can also comprise a multiprocessor computer such as the Intel Paragon.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. In a computer prediction of fluid flow within a problem space, wherein the fluid flow is represented in the computer by a set of governing relations applied to a problem space, a method for generating a grid to for use in a finite element prediction of the fluid flow, comprising dividing the problem space into grid cells by:
   a) Generating a grid having grid cell locations assigned according to Equation 6 with TE1 set to zero, wherein the grid cell locations are assigned according to Equations 19 and 22;
   b) Using the computer to model said fluid flow using said grid, comprising:
      i) Using the computer to predict velocity derivatives in a subset of said grid;
      ii) Generating a refined grid adjacent said subset having grid cell locations assigned so that TE2 errors resulting from discretization of the fluid flow model are substantially zero;
      iii) Using the computer to model said fluid flow using said refined grid.

2. The method of claim 1, wherein said step of generating a refined grid comprises generating a refined grid having grid cell locations assigned according to according to Equation 7 with TE2 set to zero.

3. The method of claim 1, wherein said step of using the computer to model said fluid flow comprises repeating steps ii) and iii), using velocity derivatives from step iii) in step ii), until a terminal condition is reached.

4. In a computer prediction of the behavior of a system, wherein the system is represented in the computer by a set of governing relations applied to a problem space, a method for generating a grid to for use in a finite element prediction of the behavior, comprising dividing the problem space into grid cells, wherein grid cell locations are assigned according to Equation 6 with TE1 set to zero, wherein the grid coordinates are assigned according to Equations 19 and 22.

5. In a computer prediction of the behavior of a system, wherein the system is represented in the computer by a set of governing relations applied to a problem space, a method for generating a grid to for use in a finite element prediction of the behavior, comprising dividing the problem space into grid cells, wherein grid cell locations are assigned according to Equation 7 with TE2 set to zero, wherein the grid coordinates are assigned according to Equations 32 and 33.

6. In a computer prediction of the behavior of a system, wherein the system is represented in the computer by a set of governing relations applied to a problem space, a method for generating a grid to for use in a finite element prediction of the behavior, comprising dividing the problem space into grid cells by:
   a) Generating an initial grid having grid cell locations assigned so that TE1 errors resulting from discretization of said governing relations are substantially zero, wherein the initial grid cell locations are assigned according to Equations 19 and 22;
   b) Using the computer to generate an initial solution of the governing relations for an initial subset of the said initial grid;
   c) Generating a subsequent grid from said initial solution having grid cell locations assigned so that TE2 errors resulting from discretization of said governing relations are substantially zero;
   d) Using the computer to generate a subsequent solution from said initial solution and said subsequent grid; p1
   e) Repeating steps c) and d), using said subsequent solution for said initial solution and said subsequent grid for said initial grid, until a terminal condition is reached.

7. In a computer prediction of fluid flow within a problem space, wherein the fluid flow is represented in the computer by a set of governing relations applied to a problem space, a method for generating a grid to for use in a finite element prediction of the fluid flow, comprising dividing the problem space into grid cells by:
   a) Generating an initial grid having grid cell locations assigned so that TE 1 errors resulting from discretization of said governing relations are substantially zero;
   b) Using the computer to generate an initial solution of the governing relations for an initial subset of the said initial grid;
   c) Generating a subsequent grid from said initial solution having grid cell locations assigned so that TE2 errors resulting from discretization of said governing relations are substantially zero, wherein the subsequent grid cell locations are assigned according to Equations 32 and 33;
   d) Using the computer to generate a subsequent solution from said initial solution and said subsequent grid;
   e) Repeating steps c) and d), using said subsequent solution for said initial solution and said subsequent grid for said initial grid, until a terminal condition is reached.

8. In a computer prediction of fluid flow within a problem space, wherein the fluid flow is represented in the computer by a set of governing relations applied to a problem space, a method for generating a grid to for use in a finite element prediction of the fluid flow, comprising dividing the problem space into grid cells by:
   a) Generating a grid having grid cell locations assigned according to Equation 6 with TE1 set to zero, wherein the grid cell locations are assigned according to Equations 19 and 22;
   b) Using the computer to model said fluid flow using said grid.

* * * * *